US006852995B1

(12) United States Patent
Eccleston et al.

(10) Patent No.: US 6,852,995 B1
(45) Date of Patent: Feb. 8, 2005

(54) FIELD EFFECT TRANSISTOR (FET) AND FET CIRCUITRY

(75) Inventors: William Eccleston, Liverpool (GB); Giles Christian Rome Lloyd, Liverpool (GB)

(73) Assignee: The University of Liverpool, Liverpool (GB)

( * ) Notice: Subject to any disclaimer, the term of this patent is extended or adjusted under 35 U.S.C. 154(b) by 0 days.

(21) Appl. No.: 10/130,003

(22) PCT Filed: Nov. 9, 2000

(86) PCT No.: PCT/GB00/04275

§ 371 (c)(1),
(2), (4) Date: Aug. 8, 2002

(87) PCT Pub. No.: WO01/35500

PCT Pub. Date: May 17, 2001

(30) Foreign Application Priority Data

Nov. 12, 1999 (GB) .............................. 9926670

(51) Int. Cl.[7] .................. H01L 51/00; H01L 29/772
(52) U.S. Cl. ................... 257/40; 257/288; 257/402
(58) Field of Search .................. 257/40, 213, 288, 257/402; 438/82, 99, 217, 289

(56) References Cited

U.S. PATENT DOCUMENTS

| 4,924,279 A | * | 5/1990 | Shimbo ...................... 357/23.7 |
| 5,744,823 A | * | 4/1998 | Harkin et al. .................. 257/68 |
| 6,001,680 A | * | 12/1999 | Ishida et al. ................. 438/238 |
| 6,150,668 A | * | 11/2000 | Bao et al. ...................... 257/40 |

FOREIGN PATENT DOCUMENTS

JP 411044892 A * 2/1999 ........... G02F/1/136

WO WO 99/54936 10/1999

OTHER PUBLICATIONS

Koch, N., et al, "Conjugated organic molecules on metal versus polymer electrodes: Demonstration of a key energy level alignment mechanism", Applied Physics Letters, vol. 82, No. 1, Jan. 6, 2003, pp. 70–72.*
"Academic Press Dictionary of Science and Technology", Ed. C. Morris, Academic Press (New York) 1992, p. 1924 (ISBN 0–1 200400–0).*
"CRC Handbook of Chemistry and Physics", 81st Edition, Ed. D.R. Lide, CRC Press, Boca Raton (2000), p. 12–197.*
C.D. Dimitrakopoulos et al, "Organic transistors with low operating voltage and high mobility", in Device Research Digest, Jun. 28–30, 1999, pp. 116–119, Santa Barbara, CA (USA).*
Boa, Z. et al., "Soluble and processable regioregular poly(3–hexylthiophene) for thin film filed–effect transistor applications with high mobility", Applied Physics Letters, 1996, 69(26), 4108–4110, XP–0020596963.
Brown, P.J. et al., "Electro–Optical Characterisation of Filed Effect Devices with Regioregular Poly–Hexylthiophene Active Layers", Synthetic Metals, 1999, 101, 557–560, XP–000934358.

(List continued on next page.)

Primary Examiner—Nathan J. Flynn
Assistant Examiner—Johannes Mondt
(74) Attorney, Agent, or Firm—Woodcock Washburn LLP

(57) ABSTRACT

A polymer-based or silicon-based accumulation type, depletion mode field effect transistor, suitable as a driver for load. Optionally, the load is another accumulation type, depletion mode field effect transistor. The transistor may be of the TFT type, either lateral or vertical. Optionally, it may have Schottky diode contacts to source and drain electrodes, possibly with a reverse biased Schottky junction, or it may have a negatively charged gate dielectric.

19 Claims, 3 Drawing Sheets

OTHER PUBLICATIONS

Hattori, R. et al., "A New Type TFT with Unique Operation and Simple Fabrication Process", *Materials Research Society Symposium Proceedings,* 1994, 345, 217–222, XP-000973842.

Klauk, H. et al., "Pentacene Thin Film Transistors and Inverter Circuits", *IEEE International Electron Devices Meeting,* 1997, 539–542, XP-000855855.

Klauk, H. et al., "Pentacene Organic Thin–Film Transistors for Circuit and Display Applications", *IEEE Transactions on Electron Devices,* 1999, 46(6), 1258–1263, XP-002158555.

Klauk, H. et al., "Fast Organic Thin–Film Transistor Circuits", *IEEE Electron Device Letters,* 1999, 20(6), 289–291, XP-002158556.

Lungu, G. et al., "Thin Film Active Matrix Organic Electroluminescent Display Development", *IEEE,* 1997, 165–168, XP-000792031.

Nakae, A. et al, "Amorphous Silicon TFT Using Schottky Barrier Contacts for Source and Drain", *Technology Reports of the Osaka University,* 1992, 42(2106), 261–267, XP-000973891.

Saitoh, A. et al., "Excimer–Laser–Produced Amorphous–Silicon Vertical Thin–Film Transistors", *Japanese Journal of Applied Physics,* 1997, 36(6a), L668–L669, Xp-000727771.

Sze, S.M. "Physics of Semiconductor Devices, $2^{nd}$ Edition", 1981, *John Wiley & Sons, New York,* 453–456, XP-002158557.

* cited by examiner

FIELD EFFECT TRANSISTOR (FET) AND FET CIRCUITRY

CROSS REFERENCE TO RELATED APPLICATIONS

This application is the U.S. National Phase filing of Application Serial No. PCT/GB00/004275, filed Nov. 9, 2000 which claims priority to United Kingdom Patent Application Serial No. 9926670.2, filed Nov. 12, 1999.

DESCRIPTION

FIELD EFFECT TRANSISTOR (FET) AND FET CIRCUITRY

The present invention is concerned with field effect transistors (FETs) and with circuits utilising FETs.

The invention is particularly, although not exclusively, relevant to thin film transistors (TFTs) and to transistors constructed using semiconductor polymer materials (TFTs may be constructed in this way). Two kinds of higher mobility conjugated organic polymers are currently available for thin film transistors: long chain regio-regular polymers (polyalkylthiophenes are one example of such materials) and short chain oligomers. The latter have demonstrated higher mobilities but at present device fabrication using the short chain oligomers is by evaporation (a process in which the material is evaporated and then forms a thin layer by sublimation), which gives rise in itself to difficulties in terms of processability.

Long chain polymers are solution processable (for example, a solution of the polymer material can be flowed or spun onto a substrate to thereby form the required polymer layer) which is a very attractive process in terms of the application of these materials in displays and other circuits requiring ultra low component cost. Solution processing is also considered potentially advantageous for fabrication of large area displays. It is thus desirable to manufacture TFTs using long chain polymers.

However there are problems in creating workable devices using the long chain polymers: these materials turn p-type under the influence of oxygen and light, and n-channel devices have not yet been realised. Inversion channels are not, therefore, possible. Consequently, research in this field has hitherto been concerned with p type field effect transistors having accumulation channels and low Schottky barriers (effectively ohmic contacts) at both source and drain. The significance of having a low Schottky barrier at the source is that it can supply holes to the polymer. Unfortunately it supplies them readily both to the channel and to the other parts of the polymer film, and the latter serves to undesirably increase the off-current of the transistor. The desired low leakage current can then only be achieved by reducing the hole concentration in the bulk of the film. This is done by processing in vacuum and away from light, a major problem in the context of low cost flow-line processing.

The present invention is however not addressed solely to problems of existing polymer based transistors. Consider a hypothetical enhancement mode p channel field effect transistor having a p type body, with a Schottky drain and source, as could be fabricated using silicon or polymer semiconductor material. An enhancement mode device requires application of a gate voltage before current is passed—the typical characteristic (drain current $I_{ch}$ against gate voltage $V_G$) of an enhancement mode device is seen at 1 in FIG. 1. In a circuit, the drain of such a device would normally be negative and the Schottky barrier at the drain junction would be forward biased. The potential drop across the drain junction would thus be small and the body would be at a negative potential with respect to the grounded source. The Schottky junction between the source and the body would be reversed and there would be a large potential barrier preventing holes from reaching the semiconductor channel region. The source junction would also control the off current of the transistor. However due to the reversed source this transistor would, when used in a circuit, require a very negative gate to create the necessary p type accumulation channel—ie. the transistor would have a very negative threshold voltage. Since the body and the drain would, due to the forward biasing of the drain junction, be at a very similar potential, the threshold voltage when the transistor was used in a circuit (with negative biasing of the drain) would be approximately equal to the negative drain voltage plus the intrinsic negative threshold voltage of the transistor (ie. the threshold voltage which would be measured at near zero drain bias).

Hence in practice the threshold gate voltage of such a transistor would be greater in magnitude than the drain voltage. This is not compatible with use of the transistor in logic circuits, where the output of one transistor must typically serve as the switching input to another transistor. The transistor would therefore not be usable as a switching element in logic circuitry.

The inventor has realised that functional circuitry including logic circuitry can however be constructed using an accumulation type field effect transistor when the transistor is such as to operate in depletion mode.

In accordance with a first aspect of the present invention there is an accumulation type, depletion mode field effect transistor operable as a switching element or driver.

An accumulation, depletion mode FET does not require an unacceptably large magnitude gate switching voltage. To understand why, consider again the example of a p channel accumulation type FET, operating this time in depletion mode. A characteristic of a p channel depletion mode transistor is seen at 3 in FIG. 1: current I flows even when the gate is at zero potential, and the intrinsic threshold voltage $V_T$ which would be measured at near zero drain bias is positive. Consequently in a practical circuit, with applied drain bias, the threshold voltage is the drain bias less the intrinsic threshold voltage, with the result that the practical threshold voltage can be lower than the applied drain voltage and the transistor is in this respect suitable for use in logic circuitry.

It is believed the potential use of depletion, accumulation transistors as switching elements/drivers has not hitherto been recognised. One reason for this is thought to be the difficulty of measuring the conventional output characteristics (drain current against drain voltage for various fixed values of gate voltage) of such a transistor. Such measurements would be taken by applying an adjustable, negative, voltage to the drain of the transistor. Because of the forward biasing of the drain junction, as a result of which the body of the transistor (in which the channel is formed) is maintained at a potential close to that of the drain, the effect of increasing the negative biasing of the drain is to make the body of the device more negative, reducing the electric field in the gate oxide layer of the FET and so turning the channel off. Consequently the conventional methods of measurement produce a peculiar characteristic curve.

To appreciate how the transistor according to the present invention can nevertheless be used in logic circuitry, consider an inverter circuit comprising an accumulation type, depletion mode FET whose source-drain path is connected in series with a resistance across a biasing potential. For the sake of example, consider the transistor to be p type, the resistance being connected between the transistor drain and the negative biasing potential. Because the resistance and the transistor together form a potential divider, an increase in gate voltage magnitude causes the drain voltage to become less negative, increasing the net gate field and effectively increasing the "gain" of the transistor beyond the intrinsic value through what is essentially positive feedback. The result is an inverter usable in logic circuits.

The transistor according to the present invention may be implemented using silicon, but in a particularly preferred embodiment of the present invention the transistor comprises semiconductor polymer material. Such material can form the transistor body. The currently preferred materials are long chain regio-regular polymers. The advantages of such materials—particularly their solution processability—have been referred to above.

The currently most preferred long chain regio-regular polymer materials are polyalkylthiophenes, including polyoctylthiophenes and polyhexylthiophenes.

In the transistor according to the present invention, wherein a junction of the transistor, eg. with the source, preferably provides a Schottky barrier which is reverse biased in operation. Preferably this barrier is substantially 10 kT per electron or greater.

The body/drain junction is preferably forward biased in operation.

The FET according to the present invention is preferably p type. That is, the majority carriers in the channel are holes. As has been mentioned above, the preferred polymer materials become p type under the influence of oxygen and light. Hence p type polymer transistors embodying the invention can be fabricated without the difficulties involved in excluding air and light.

The FET according to the present invention is preferably a thin film transistor (TFT).

Conventional TFTs have a horizontal structure, the source and drain being laterally separated and the film forming the semiconducting body extending between them. The FET according to the present invention may have a horizontal structure.

However in an especially preferred embodiment, the FET according to the present invention is a TFT in which the source is displaced from the drain along a direction which is perpendicular or oblique to the plane of a substrate on which the FET is formed. Such a structure will be referred to herein as "vertical". In such a device the length of the transistor channel can be determined by the depths of layers making up the FET. The channel length can be reduced as compared with horizontal transistors, with consequent reduction in the switching time of the FET, a particularly important consideration with polymer based transistors.

A particularly preferred p-type FET according to the present invention has a gate oxide layer comprising dielectric material with a negative fixed charge. This allows the threshold voltage to be reduced in order to implement a depletion FET. Alumina is a suitable dielectric material.

It is preferred that the magnitude of the gate voltage required to turn the transistor off is equivalent to a potential of substantially 10 KT per electron (hole) or greater, where K is Boltzmann's constant and T is the transistor's intended operating temperature in Kelvin. At room temperature, this implies that the magnitude of the gate voltage required to turn the transistor off is substantially 0.25 volts or greater. In FIG. 1, this off voltage is seen as the gate voltage $V_G$ at which the characteristic 3 of the transistor meets the horizontal axis representing $I_{ch}=0$.

In accordance with a second aspect of the present invention, there is a circuit comprising an FET according to the first aspect of the present invention, connected as a driver to a load. The load may take the form of a resistor. Preferably, however, the load comprises a further transistor, more preferably an FET. The source and gate of the load FET are preferably connected.

Fabrication can be simplified if the construction of one or more components of the driver and load transistors can be achieved in a single operation. To this end, the driver and load are preferably of the same type (n or p). It is also preferred that the load be a depletion type FET.

Preferably the source/drain path of the driver FET is connected in series with the load, a biasing voltage being applied across this series combination. Where the driver FET is of p type, its drain may be connected via the load to a negative bias voltage.

The circuit according to the present invention is preferably a logic circuit.

Preferably the circuit is formed as an integrated circuit.

According to a third aspect of the present invention, there is a visual display comprising a circuit according to the second aspect. The display is preferably of thin film type.

According to a fourth aspect of the present invention, there is a transistor comprising a source and a drain which form respective junctions with a body of semiconductor material in which a channel is formed through which current passes between source and drain in use, the body/drain junction being forward biased with respect to the majority carriers in the channel and the source/drain junction having a Schottky barrier which is blocking with respect to the majority carriers of the channel, the transistor further comprising a gate electrode electrically isolated from the body and disposed to modulate current in the channel, and being such that the channel formed in use is of the same type (n or p) as the body and that an applied gate voltage is required to prevent current flow between source and drain.

According to a fifth aspect of the present invention, there is a circuit comprising a transistor according to the fourth aspect of the present invention, arranged to function as a switching element or driver.

Specific embodiments of the present invention will now be described, by way of example only, with reference to the accompanying drawings in which:—

Figure 1:
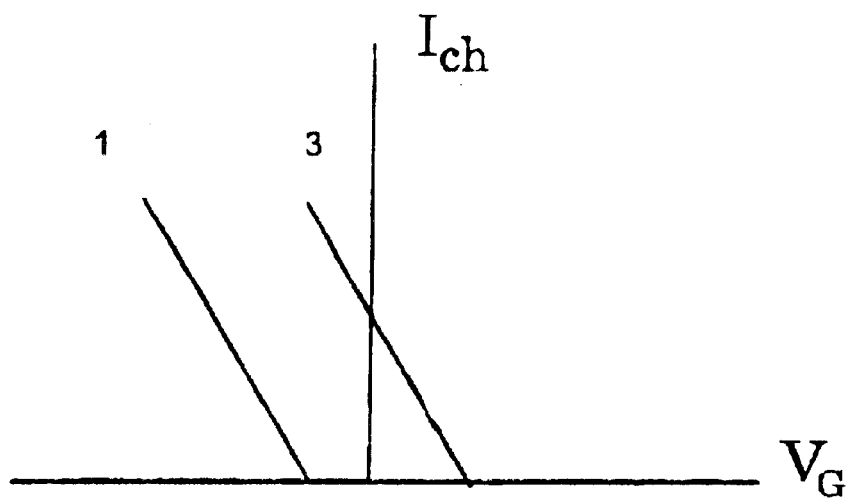
FIG. 1 illustrates, in somewhat simplified form, characteristics of enhancement and depletion mode transistors, gate voltage $V_G$ being shown along the horizontal axis and source-drain current $I_{CH}$ being shown on the vertical axis.
Figure 2:
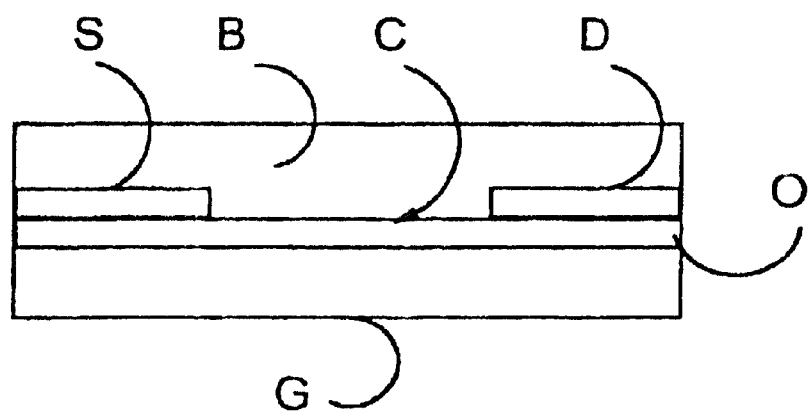
FIG. 2 is a vertical section through a horizontal type thin film transistor structure which may be used to implement the present invention.

A structure for a horizontal polymer based thin film transistor (TFT) formed as an insulated gate field effect transistor (IGFET) is illustrated in FIG. 2. The illustrated structure is in itself known and comprises successive layers deposited on a substrate to form, from the substrate level upward:—

I) a gate layer G;
ii) an insulating gate oxide layer O;
iii) a partial layer forming the source S and drain D; and
iv) lying over (ii) and (iii), a body layer B comprising the semiconductor polymer itself.

While the general structure illustrated is known, the FET under consideration embodies the present invention. The body is in this exemplary embodiment of p type semiconductor material and, since the FET is an accumulation transistor, the channel formed in the region labelled C in operation is also p type. Schottky barriers exist at the junctions of the source S and drain D with the body and the drain junction is forward biased, so that when in use a negative voltage is applied to the drain, the body sits a voltage only slightly smaller in magnitude than that applied to the drain. The source junction is reverse biased and so controls "off" current through the transistor A limit is placed on the speed of switching of this horizontal FET by the distance between the gate and source (ie. by the length of the channel). Photolithography is used to define the lateral extent of the various layers, and this process disposes a lower limit on lateral dimensions including the channel length. With ideal devices, where there is little overlap between gate and drain electrodes, and therefore minimal inactive capacitance, the switching time in an inverter where the driver has a channel length L is $\mu/L^2$, $\mu$ being the hole mobility (for a p type device). The relatively low mobilities achieved with polymers, and particularly with the long chain polymers, make it important to minimise channel length in order to maximise switching speed.

A further disadvantage of horizontal structures is that there is in practice considerable overlap between the gate/source and gate/drain. The latter is emphasised because in an inverter circuit the phase difference causes an effective doubling of the drain capacitance which is inactive: it does not contribute to channel formation.

Figure 3:
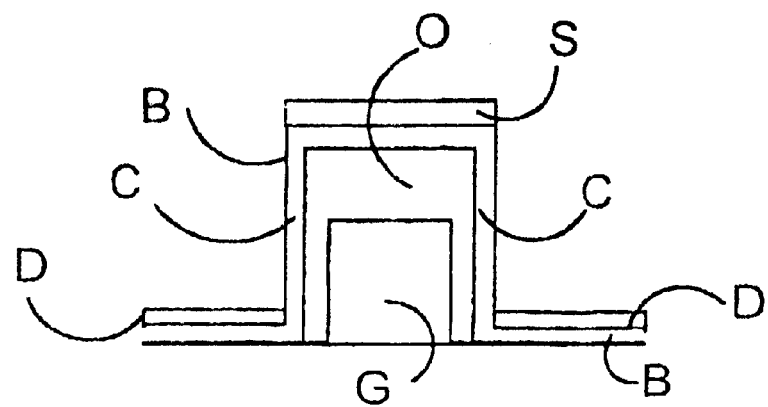
FIG. 3 is a vertical section through a vertical type thin film transistor embodying the present invention.

A preferred construction for a transistor embodying the present invention is illustrated in FIG. 3, and is of the type referred to herein as "vertical". The drain and source are separated along the vertical direction—ie in a direction perpendicular to the plane of the substrate on which the transistor is formed. In such a structure the channel length is determined by the depth of layers forming the transistor and can be reduced as compared with a horizontal structure. The FIG. 3 transistor comprises:

I) a gate electrode G formed on the substrate;
ii) a gate oxide layer O formed over the gate electrode;
iii) a polymer layer B (forming the transistor body) which is formed over the gate oxide and also has outer regions extending horizontally over the surrounding substrate;
iv) electrically coupled drain electrodes D formed upon the outer regions of the gate oxide; and
v) a source electrode S disposed above the gate, upon the gate oxide.

In this structure a pair of channels are formed in vertically extending regions C of the polymer body layer B and operate in parallel. Compared with horizontal structures, the FIG. 3 transistor has much reduced inactive capacitance, and a switching speed which approximates more closely to the $\mu/L^2$ ideal.

Figure 7:
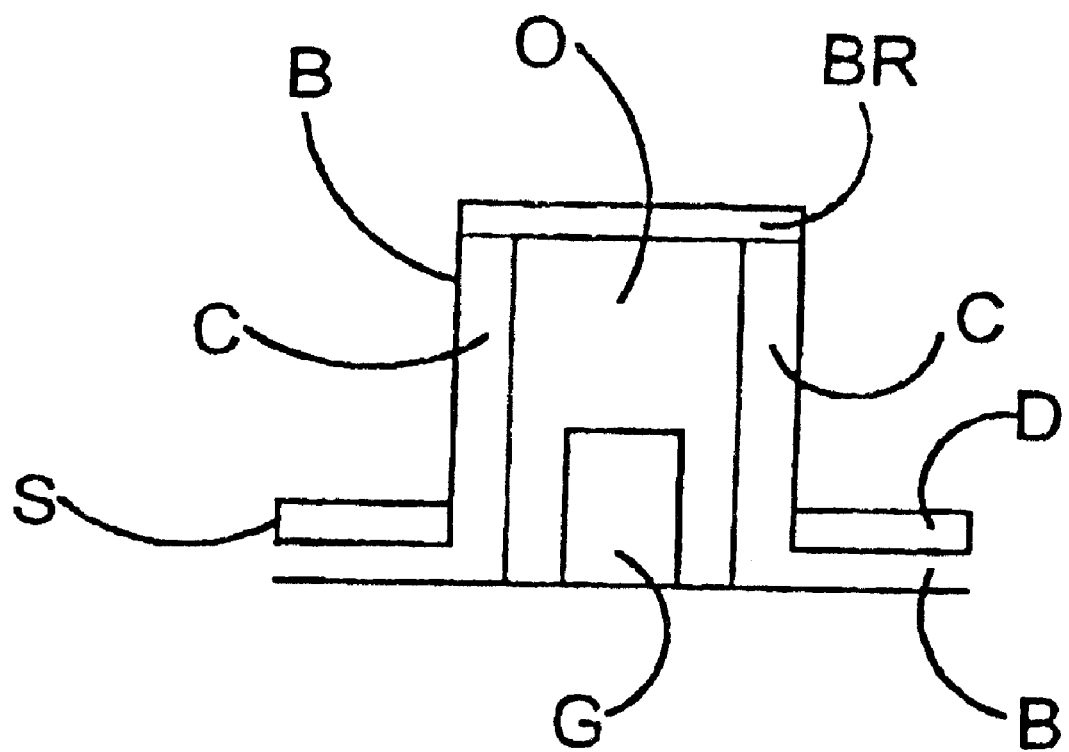
FIG. 7 is a vertical section through a second vertical type thin film transistor embodying the present invention.

The need, in circuitry utilising the transistor illustrated in FIG. 3, to form a connection to the source which is above the plane of the circuit can complicate manufacture, eg where the gate of one transistor must be connected to the drain of another. Illustrated in FIG. 7 is an alternative construction not subject to this difficulty. In FIG. 7 the elements of the transistor bear the same labels as in FIG. 3. Here the source S and the drain D are both formed upon the outer regions of the gate oxide, close to the plane of the circuit, making the formation of connections to both straightforward. The item labelled BR is a conductive bridge, formed in the present embodiment of gold, whose two junctions with the transistor body B are ohmic. In place of the two parallel channels of the transistor illustrated in FIG. 3, the FIG. 7 transistor has channels $C_1$ and $C_2$ connected in series (by the bridge BR) between the source and drain. The operation of the transistor in a circuit is however the same as the operation of the FIG. 3 transistor.

At the current stage in development of the invention, the preferred way to achieve a p channel depletion transistor is by utilising a gate oxide layer comprising alumina (oxidised aluminium). It is well known that some dielectric materials have negative fixed charge. Alumina was shown many years ago to reduce the threshold voltage of p channel silicon devices which is consistent with it having negative fixed charge. Alumina also has a much higher dielectric constant than silicon dioxide which can also be beneficial in increasing transistor performance. It is also fully compatible with the fabrication of vertical devices.

Negative charge in the oxide induces a hole channel at zero applied gate voltage, as required for a depletion device. As mentioned above, alumina has been found to have this property. It can be produced by anodisation in a suitable liquid or oxygen plasma. It has the advantage of a high dielectric constant which improves the effectiveness of the gate voltage. Alumina is not the only suitable material. Other oxides have the same property and may prove to be preferable because they may give a more electrically robust oxide than anodised aluminium.

Figure 4:
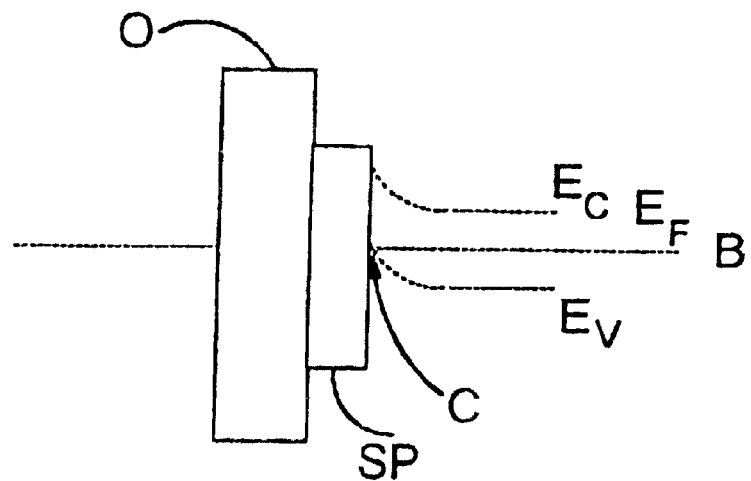
FIG. 4 is a section through a part of an FET embodying the present invention, illustrating the interface between semiconductor body and gate oxide.

The interface between most conducting materials and oxides is poor. This is even true of silicon and its natural oxide. Traps for free carriers occur because of what are sometimes referred to as dangling bonds. Placing a wide band gap material at the interface is one possible way to alleviate this problem. FIG. 4 illustrates a suitable structure in which an intermediate band gap spacer SP is interposed between the metal oxide layer O and the channel-forming portion of the body B. The general form of the valence and conduction band edges Ec and Ev are illustrated relative to the Fermi level F. This structure has similarity with the HEMT (High Electron Mobility Transistor) well known in silicon.

Figure 5:
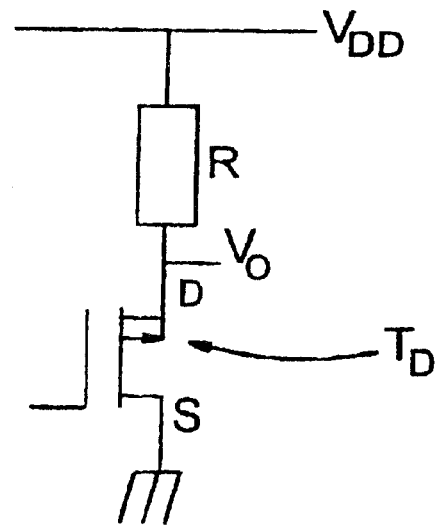
FIG. 5 is a diagram of a first inverter circuit constructed in accordance with the present invention.

Illustrated in FIG. 5 is an inverter constructed using a driver transistor $T_D$ constructed in accordance with the present invention. The source S is grounded and the drain D is connected via a resistor load R to the supply voltage $V_{DD}$. As has been explained above, in this arrangement an increase of the gate voltage causes the drain voltage to become less negative, enabling the inverter to be switched by acceptable gate voltages.

Resistor loads are not preferred for producing inverters in integrated circuits since they tend to be large in area and difficult to control in value. In silicon based devices, CMOS logic circuitry is preferred, in which an inverter is implemented using an n and a p type transistor. However the need to fabricate both n and p type transistors on the same chip complicates the fabrication process and CMOS is not widely used in some known circuits, such as DRAM, where the processing is already complex. When superimposed on the need to produce five or more layers of conductors and trenched capacitors, CMOS is inconsistent with high yield and, therefore, low cost. Instead n channel depletion transistor loads are used for DRAM.

In polymer based devices too, a need for both n and p channel transistors adds to the difficulty of fabrication: different polymers are required which have to be fabricated separately.

Figure 6:
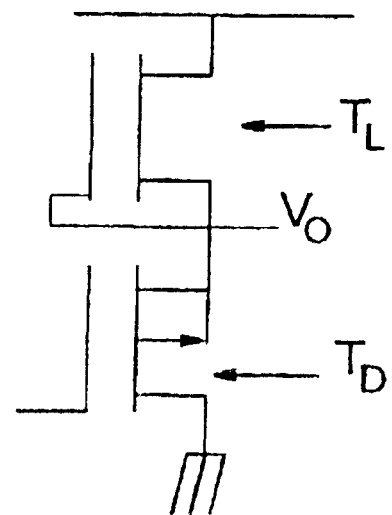
FIG. 6 is a diagram of a second inverter circuit constructed in accordance with the present invention.

In the inverter circuit illustrated in FIG. 6, the polymer driver $T_D$ embodies the present invention and is a p channel depletion transistor. The load transistor $T_L$ is, for the sake of constructional simplicity, likewise a p channel depletion transistor. It operates with gate and source connected and has, therefore, a channel current flowing, except when the drain and source are at the same potential. With the driver off (input logic zero), the current in both driver and load are both virtually zero and so, therefore, is the potential difference between drain and source of the depletion load. The output voltage is then high, at $V_{DD}$, the most desirable value.

What is claimed is:

1. A field effect transistor comprising a source and a drain which form respective junctions with a body of polymer semiconductor material in which a channel is formed through which current passes between source and drain in use, the transistor further comprising a gate electrode electrically isolated from the body and disposed to modulate current in the channel and having a Schottky barrier at the source/body junction which is substantially 10 kT or greater, where K is Boltzmann's constant and T is the transistor's intended operating temperature, and which is arranged to be reverse biased in use, the transistor being adapted for operation in accumulation mode, the majority carrier in the channel being of the same type (n or p) as the majority carrier in the remainder of the body, and being of depletion type, an applied gate voltage being required to prevent current flow between source and drain.

2. A field effect transistor as claimed in claim 1, wherein the semiconductor polymer material is a long-chain regio-regular polymer.

3. A field effect transistor as claimed in claim 2 wherein the long chain regio-regular polymer material is a polyalkylthiophene.

4. A field effect transistor as claimed in claim 1, wherein the body/drain junction of the transistor is arranged to be forward biased.

5. A field effect transistor as claimed in claim 1 which is of p-type.

6. A field effect transistor as claimed in claim 1 in the form of a thin film transistor.

7. A field effect transistor as claimed in claim 6, comprising a thin film transistor of vertical structure.

8. A field effect transistor as claimed in claim 6, wherein the thin film transistor has a vertical structure and wherein the source is displaced from the drain along a direction which is perpendicular or oblique to the plane of a substrate on which the transistor is formed.

9. A field effect transistor as claimed in claim 1 which is of p-type and has a gate oxide layer comprising dielectric material with a negative fixed charge.

10. A field effect transistor as claimed in claim 9, wherein the dielectric material is alumina.

11. A field effect transistor as claimed in claim 1, in which the magnitude of the gate voltage required to turn the transistor off is substantially 10 KT/Q or greater, where K is Boltzmann's constant, Q is the electronic charge, and T is the transistor's intended operating temperature in Kelvin.

12. A circuit comprising a field effect transistor as claimed in claim 1, connected as a driver to a load.

13. A circuit as claimed in claim 12, wherein the load is a resistor or a further transistor.

14. A circuit as claimed in claim 13, wherein the further transistor is a further field effect transistor.

15. A circuit as claimed in claim 14, wherein the source and gate of the further field effect transistor are connected.

16. A circuit as claimed in claim 14 or 15, wherein the further field effect transistor is a depletion type FET.

17. A circuit as claimed in any of claims 12 to 15, wherein the circuit is a logic circuit.

18. A visual display comprising a circuit as claimed in any of claims 12 to 15.

19. A visual display as claimed in claim 18 which is of thin film type.

* * * * *